United States Patent
Bouche (10) Patent No.: US 7,268,653 B2
(45) Date of Patent: Sep. 11, 2007

(54) MICROELECTROMECHANICAL SYSTEM ABLE TO SWITCH BETWEEN TWO STABLE POSITIONS

(75) Inventor: Guillaume Bouche, Grenoble (FR)

(73) Assignee: Stmicroelectronics S.A., Montrouge (FR)

(*) Notice: Subject to any disclaimer, the term of this patent is extended or adjusted under 35 U.S.C. 154(b) by 170 days.

(21) Appl. No.: 11/050,482

(22) Filed: Feb. 3, 2005

(65) Prior Publication Data
US 2005/0206243 A1 Sep. 22, 2005

(30) Foreign Application Priority Data
Feb. 4, 2004 (FR) .................. 04 010704

(51) Int. Cl.
*H01H 51/22* (2006.01)
(52) U.S. Cl. ......................... 335/78; 200/181
(58) Field of Classification Search ................. 335/78; 200/181
See application file for complete search history.

(56) References Cited

U.S. PATENT DOCUMENTS

| 5,463,233 | A  | * | 10/1995 | Norling ................... 257/254 |
| 6,057,520 | A  | * | 5/2000  | Goodwin-Johansson .... 200/181 |
| 6,303,885 | B1 | * | 10/2001 | Hichwa et al. ............ 200/181 |
| 6,351,201 | B1 |   | 2/2002  | Foster |
| 6,473,361 | B1 |   | 10/2002 | Chen et al. |
| 6,621,390 | B2 | * | 9/2003  | Song et al. ................ 335/78 |
| 6,768,412 | B2 | * | 7/2004  | Becka et al. ............. 337/36 |
| 6,812,820 | B1 | * | 11/2004 | Fouillet .................. 337/333 |
| 2006/0152328 | A1 | * | 7/2006 | Robert ................... 337/333 |

FOREIGN PATENT DOCUMENTS

DE 100 40 867 5/2002
EP 1 220 256 7/2002

OTHER PUBLICATIONS

Patent Abstracts of Japan, vol. 2003, No. 7, Jul. 3, 2003; and JP 2003 062798, Advantest Corp., Mar. 5, 2003.
French Preliminary Search Report, FR 04 01074, dated Jul. 2, 2004.

* cited by examiner

*Primary Examiner*—Elvin Enad
*Assistant Examiner*—Bernard Rojas
(74) *Attorney, Agent, or Firm*—Gardere Wynne Sewell LLP (57) ABSTRACT

A microelectromechanical system includes separate conducting elements. An electromechanically deformable element can be switched between a first stable position and a second stable position. Contact elements allow for electrical continuity to be established between the separate conducting elements. Switch control elements ensure that the first deformable element switches so as to establish electrical continuity between the separate conducting elements in the second stable position, by contact between the contact elements, and to break electrical continuity by separating the contact elements in the first stable position. The separate conducting elements and the contact elements are carried by the deformable element.

26 Claims, 5 Drawing Sheets

MICROELECTROMECHANICAL SYSTEM ABLE TO SWITCH BETWEEN TWO STABLE POSITIONS

PRIORITY CLAIM

This application claims priority from French Application for Patent No. 04 01074 filed Feb. 4, 2004, the disclosure of which is hereby incorporated by reference.

BACKGROUND OF THE INVENTION

1. Technical Field of the Invention

The present invention relates to an electromechanical device with a deformable element. This type of device may constitute a microswitch particularly suitable for switching elements of an electronic, electrical or optical circuit.

Such a microswitch may comprise a microelectromechanical systems (MEMS) having two different states in order to open or close a circuit and thus actuate or deactuate the operation of an electronic, optical or other device. MEMS are widely used in applications such as telecommunications, radiofrequency communications, portable electronics, commercial, industrial or aerospace electronics, and also in other fields.

2. Description of Related Art

MEMS with deformable elements generally comprise a deformable element in the form of a beam, which is attached, via only one end or by opposed ends, to a substrate and makes it possible to achieve switching between a first stable position and a second stable position by a thermal bimetallic effect, or by electromagnetic and/or electrostatic actuation.

Figure 1A:
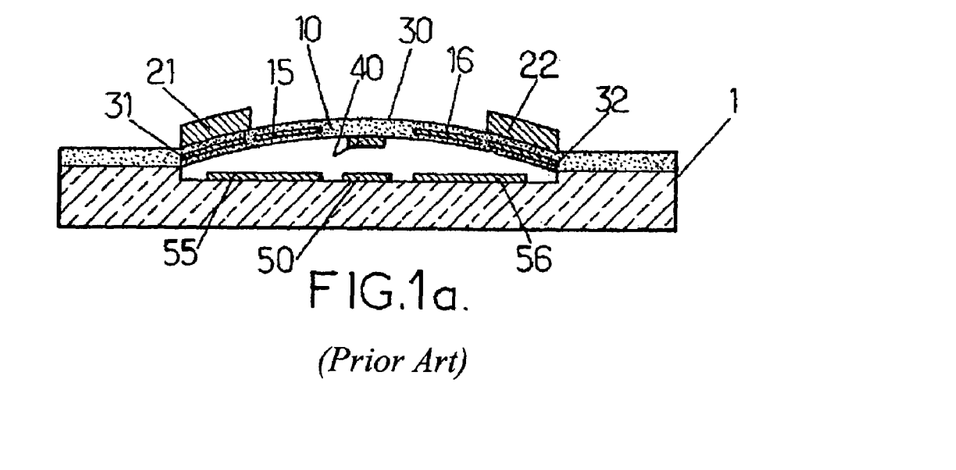
FIG. 1(a) is a diagram in vertical section of a microelectromechanical system in a first stable position.
Figure 1B:
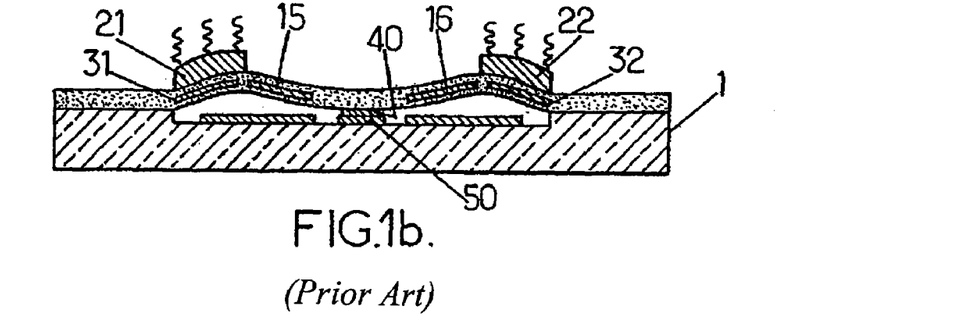
FIG. 1(b) is a diagram in vertical section of a microelectromechanical system deformed by the bimetallic effect through the action of the resistive elements.
Figure 1C:
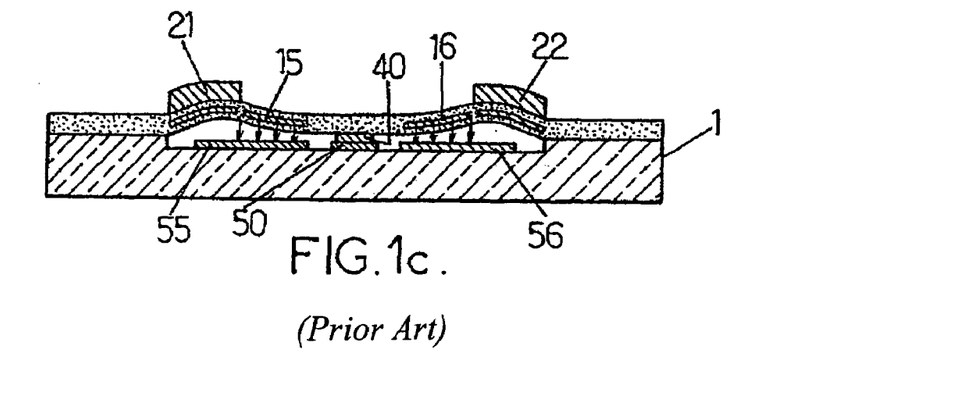
FIG. 1(c) is a diagram in vertical section of a microelectromechanical system in a second stable position, retained by the electrostatic retention elements.

FIGS. 1(a) to 1(c) show a known construction of a microsystem according to European Patent EP 1,220,256, the disclosure of which is hereby incorporated by reference.

This microsystem is produced on a substrate 1. The substrate 1 supports separate conducting elements 50 that are simply separated by a small gap plumb with a deformable element having the form of a beam 10. The beam 10 can deform in a cavity provided in the substrate 1. The beam is provided, on the side of the cavity, with a contact element 40 capable of ensuring electrical continuity between the separate conducting elements 50 when the beam 10 bends into the cavity. The beam 10 supports two resistive elements 21 and 22 located near the ends of the beam and having a thermal expansion coefficient different from that of the beam 10. The elements 21 and 22 form switch control means for switching the beam. Electrostatic retention electrodes are also placed in pairs facing each other, namely the pair of electrodes 15 and 55 on one side and the pair of electrodes 16 and 56 on the other. The electrodes 15 and 16 are supported by the beam 10. They may also be included in the beam. The electrodes 55 and 56 are placed in the bottom of the cavity, on the substrate 1.

FIG. 1(a) shows the microelectromechanical system in the deactivated state, since the contact element 40 does not ensure electrical continuity between the separate conducting elements 50.

When an electrical control current flows directly in the resistive elements 21 and 22 or in electrodes 31 and 32 included in the beam 10 beneath the elements 21 and 22 respectively, the heat supply that results therefrom causes the beam to bend, by the bimetallic effect, towards the bottom of the cavity. The contact element 40 then bears on the separate conducting elements 50 and ensures electrical continuity. This is shown in FIG. 1(b). The microelectromechanical system is then in the actuated state.

The electrodes 15 and 55 on one side and 16 and 56 on the other are then separated by a minimum distance and ensure, by the application of suitable voltages, the electrostatic retention of the bent beam when the electrical current ceases to flow in the resistive elements 21 and 22, or the electrodes 31 and 32, as shown in FIG. 1(c). The removal of the electrostatic retention voltages allows the beam to resume its rest position. The microelectromechanical system then returns to the deactuated state (FIG. 1(a)).

However, this construction has drawbacks as regards ensuring reliability of the contact when faced with wear owing to a very high number of cycles (greater than $10^9$) as in certain types of application. Deterioration of the contact may result in capacitive transmissions between the separate conducting elements in the deactuated position. The use of protuberances on the contacts is not a satisfactory solution because of the difficulties associated with positioning them.

Another problem associated with this embodiment is the electrical voltage needed for retention in the closed position. The lowest possible electrical consumption constitutes in fact a common constraint in all types of microelectromechanical systems, either as regards autonomy in the case of portable systems or as regards limiting thermal heat-ups in all cases.

Finally, the manufacturing uncertainties, owing to the typical dimensions of the deformable element (the ratio of the bending deflection of the deformable element to its length may be from 1 to 200), is a contributory factor in reducing contact reliability.

SUMMARY OF THE INVENTION

Embodiments of the present invention address the foregoing and other problems by providing the conducting elements associated with the contact elements on the deformable element.

An embodiment of the invention is a microelectromechanical system comprising separate conducting elements, a first electromechanically deformable element that can switch between a first stable position and a second stable position, contact elements allowing electrical continuity between the separate conducting elements, and switch control elements ensuring that the first deformable element switches so as to establish electrical continuity between the separate conducting elements in the second stable position by contact between the contact elements and to break this electrical continuity by separating the contact elements in the first stable position. The separate conducting elements and the contact elements are carried by the first deformable element.

Thus, the reliability of the contact does not rely on two separate elements, the separation of which is likely to be poorly controlled and to vary over time.

The switch control elements of the microelectromechanical system may advantageously comprise a second electromechanically deformable element, separate from but joined to the first deformable element. The control elements are thus distributed on the two deformable elements. Each of them ensures switching from one of the defined stable positions into the other.

Preferably, the stable positions may correspond to respective buckling positions of at least one of the two deformable elements. Retention of the electrical contact is thus provided by means of the internal energy stored in at least one of the deformable elements, without requiring an external retention force. Moreover, the risk of misalignment of the contact elements is greatly reduced since a change in the geometry of the beams, which is associated with a variation in the stresses over time, results in the same displacement of the contact elements.

In accordance with an embodiment of the invention, a semiconductor structure comprises a substrate, an electromechanically deformable element having a portion thereof suspended above the substrate, a first conductor positioned on the electromechanically deformable element, the first conductor including a first contact element, and a second conductor also positioned on the electrically deformable element, the second conductor including a second contact element separated from the first contact element. The first and second contact elements touch each other when the electromechanically deformable element is deformed.

In accordance with another embodiment, a semiconductor structure comprises a substrate, an electromechanically deformable element having a portion thereof suspended above the substrate, the electromechanically deformable element being deformable between a first stable position and a second stable position, a first conductor positioned on the electromechanically deformable element, the first conductor including a first contact element, and a second conductor also positioned on the electrically deformable element, the second conductor including a second contact element separated from the first contact element when the electromechanically deformable element is in the first stable position, the second contact element touching the first contact element when the electromechanically deformable element is in the second stable position.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

Figure 2A:
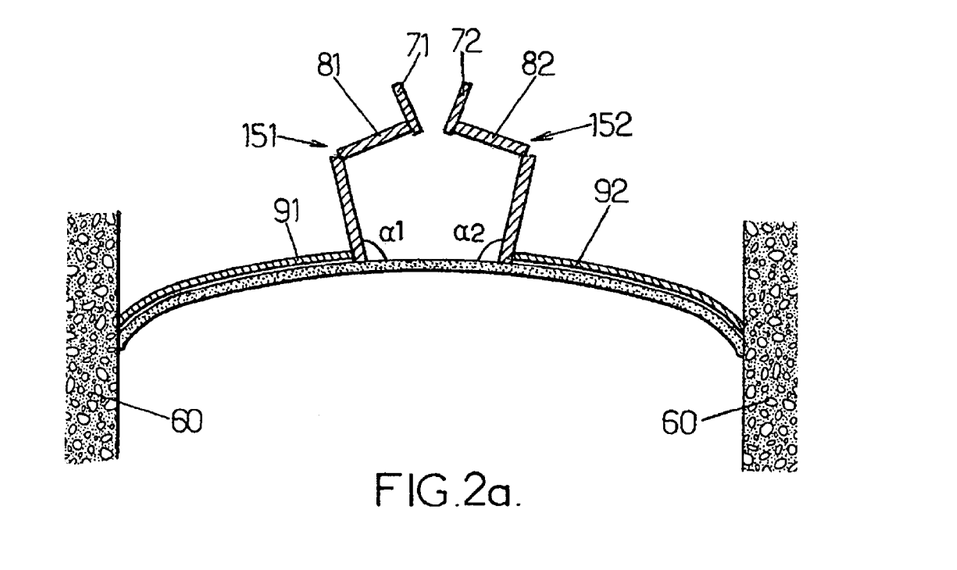
FIG. 2(a) is a diagram showing the principle of the microelectromechanical system according to the invention in a first stable position.
Figure 2B:
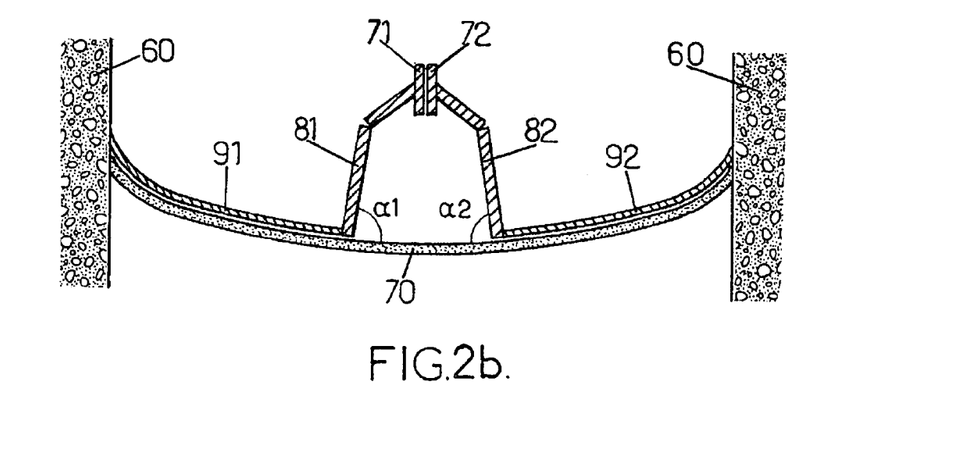
FIG. 2(b) is a diagram showing the principle of the microelectromechanical system according to the invention in a second stable position.

The construction principle of the microelectromechanical system according to an embodiment of the invention is shown in FIGS. 2(a) and 2(b). A moving element in the form of a beam 70 is held in compression between two fixed elements 60. The beam therefore undergoes a lateral deformation owing to the end load that makes it work in compression, or buckling. The beam 70 may therefore occupy two stable positions corresponding to a minimum internal energy. A first stable position, also called the open position, is shown in FIG. 2(a) and a second stable position, also called the closed position, is shown in FIG. 2(b).

In FIG. 2(a), separate conducting elements 91 and 92 are joined to the beam 70. Two substantially rigid arms 81 and 82, having ends 71 and 72, are connected to the separate conducting elements 91 and 92, respectively, and make non-zero angles α1 and α2. Here they are chosen to be substantially right angles. The arms 81 and 82, associated with the respective ends 71 and 72, form the contact elements 151 and 152, respectively. In the open position, the arms are arranged so that their respective ends 71 and 72 are not in contact with each other: there is therefore no electrical continuity between the conducting elements 91 and 92, and the microelectromechanical system is in the deactuated state.

When the beam 70 switches to the second stable position or closed position, by switch control elements (not shown), it causes the conducting elements 91 and 92, and also the arms 81 and 82, to bring the ends 71 and 72 into contact. The configuration shown in FIG. 2(b) is then obtained. There is then electrical continuity between the conducting elements 91 and 92 and the microelectromechanical system is in the actuated state. The two separate conducting elements 91 and 92 are therefore held in contact via the two arms 81 and 82 and their ends 71 and 72 thanks solely to the internal energy of the beam 70 associated with the buckling. There is therefore no reliance on an external force in order to maintain contact between the separate elements via the contact elements 151 and 152, apart from the temporarily energy needed for the switching.

Figure 3:
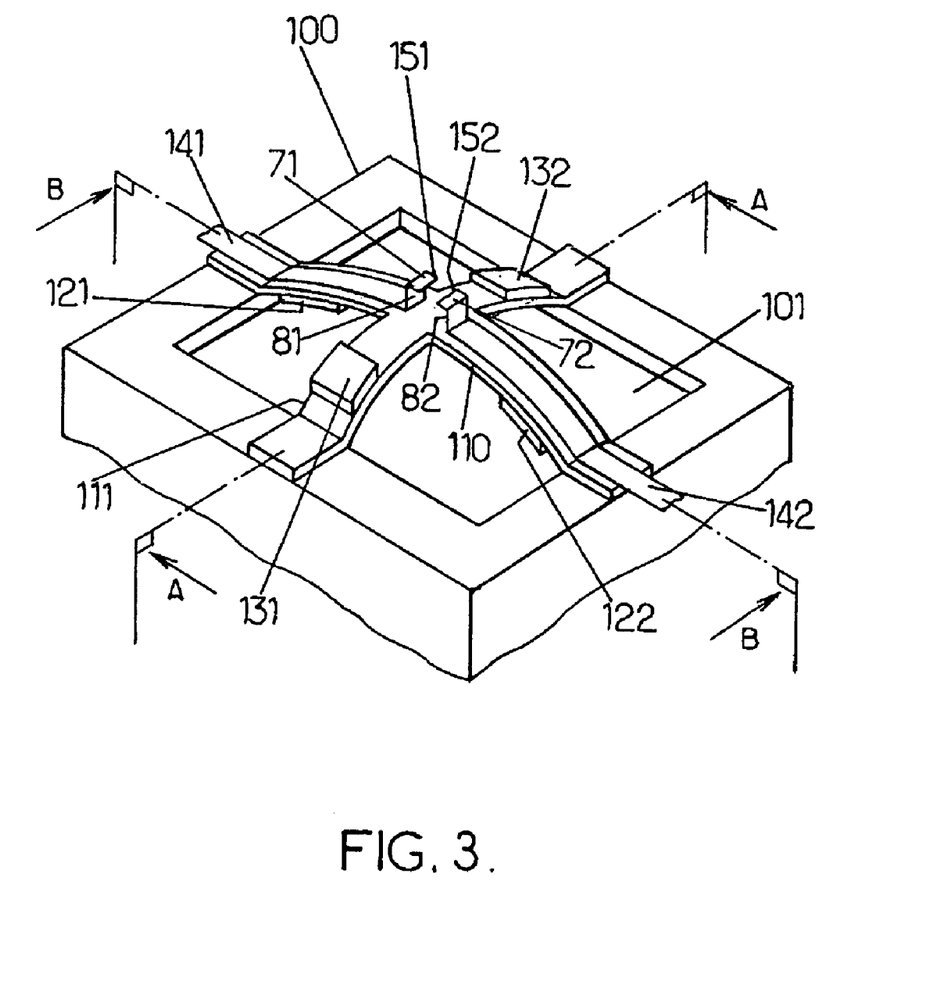
FIG. 3 is a schematic view, in perspective, of one embodiment of a microelectromechanical system according to the invention.

An illustrative example of a microelectromechanical system according to the invention is shown schematically in FIG. 3. A microelectromechanical system is produced on a substrate 100 formed from one or more layers, which may or may not be identical, for example made of silicon, silica, glass or quartz. Two integral deformable elements 110 and 111, for example in the form of a beam or membrane, and forming a cross pattern, are deposited on the substrate 100.

They are made of a material that is a poor thermal conductor, for example silicon nitride (Si$_3$N$_4$), silicon oxide (SiO$_2$), polysilicon (poly-Si), titanium nitride (TiN) or tantalum nitride (TaN). The two beams occupy a first stable buckling position thanks to the manufacturing of the deformable elements, which will be explained below. A cavity 101 is provided in the substrate 100 so as to allow the beams 110 and 111 to switch towards the second stable buckling position. The beam 110 is provided with two separate conducting elements 141 and 142, fitted respectively with contact elements 151 and 152. The contact elements 151 and 152 comprise the arms 81 and 82 associated respectively with the ends 71 and 72. The arms 81 and 82 are substantially rigid and make non-zero angles α1 and α2 with the beam 110. The first stable position shown in FIG. 3 corresponds to the open position, since the ends 71 and 72 of the arms 151 and 152 provide no electrical continuity between the conducting elements 141 and 142.

Several types of switch control element can be envisaged for actuating or deactuating the microelectromechanical system. They comprise first switch control elements for switching from the second stable position (closed position) into the first stable position (open position) and second switch control elements for the reverse switching, from the first stable position into the second stable position. An example of thermal switch control elements is shown in FIG. 3. The beam 110 supports two resistive elements 121 and 122 located near the ends of the beam and in intimate contact therewith. These resistive elements must have a thermal expansion coefficient different from that of the beams and may be deposits of a conducting material, for example aluminium, manganese, zinc, gold, platinum, nickel or Inconel 600®. The beam 111 also supports two resistive elements 131 and 132 located near the ends of the beam and in intimate contact with the latter, but on a face on the opposite side to that on which the resistive elements 121 and 122 are located. It is also possible to envisage depositing, in the deformable elements, plumb with the four resistive elements 121, 122, 131 and 132, heating electrodes (not shown), for example made of titanium nitride, which control the supply of heat received by the resistive elements. The heating electrodes or the resistive elements are connected directly to current sources via connection lines (not shown).

Starting from the open position, when an electrical control current flows in the resistive elements 131 and 132 or in the heating electrodes located plumb with 131 or 132, the heat supply that results therefrom causes, by the bimetallic effect, the beams 111 and 110 to bend towards the bottom of the cavity 101 into the second stable position. In fact, the bending of the beam 111 causes the beam 110 to bend, since the two beams 110 and 111 are integral with each other. The ends 71 and 72 of the arms 151 and 152 are brought into contact and ensure electrical continuity between the conducting elements 141 and 142. The microelectromechanical system is then in the actuated state.

Conversely, when an electrical control current flows in the resistive elements 121 and 122, or in the heating electrodes located plumb with 121 and 122, the supply of heat that results therefrom causes, by the bimetallic effect, the beams 110 and 111 to bend back into the first stable position. Electrical continuity between the conducting elements 141 and 142 is broken by the separation of the contact elements 151 and 152. The microelectromechanical system is then deactuated.

Other embodiments of the switch control elements may be envisaged.

It is possible to envisage control elements comprising an electrostatic actuation as disclosed in European Patent EP 1,220,256 mentioned above. They comprise at least one pair of facing electrodes, one of the electrodes is integral with one of the deformable elements and the other is positioned at the bottom of the cavity 101, facing the first electrode. The distance between the electrodes is maximum when the microelectromechanical system is deactuated, in the first stable position. These electrodes are used not for keeping the microelectromechanical system in the actuated position, as in EP 1,220,256, but to ensure switching into the second stable position by applying electrostatic voltages to the electrodes. The distance between the two electrodes is then minimum. The switching into the first stable position may be achieved by thermal switching means or the like, explained below.

Electromagnetic control means, using a polarizable magnetic field, for switching from one stable position to another are known from U.S. Pat. No. 6,496,612 B1, the disclosure of which is hereby incorporated by reference. They comprise at least one magnetically sensitive element integral with one of the deformable elements, together with elements that generate a variable magnetic field and are suitable for causing switching into one of the stable positions.

It is also possible to substitute the resistive elements with piezoelectric deformation elements, which are positioned on either side of one of the beams or on opposed faces on each of the two beams. Starting from the open position, application of a first voltage to the upper elements allows them to switch into the closed position, whereas application of a second voltage to the upper elements causes the reverse switching.

It is also possible to make use of separate first and second switch control elements for respectively switching into the first stable position on the one hand, and switching into the second stable position on the other, by combining one of the above switch control types.

It is also possible to envisage the case of a microelectromechanical system having only a single deformable element. The first and second switching means are then carried by this single deformable element.

FIGS. 4(a) to 4(f) show sectional views of an example of one possible process for manufacturing a microelectromechanical system according to the invention, with four resistive elements as switch control elements, two per deformable element, and heating electrodes plumb with them. The first and second switch control elements are therefore identical. The plane of the cross-section is along the plane A-A of FIG. 3. FIG. 4(g) shows a top view of the final step in the example of the fabrication process.

Figure 4A:
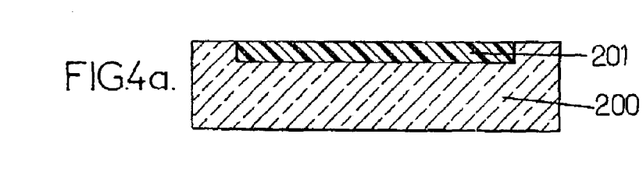
FIG. 4(a) is a schematic sectional view on A-A of a first step in the manufacturing of a microelectromechanical system according to the invention.

FIG. 4(a) shows the first step with the etching of a substrate 200, for example made of silicon, and the deposition of a sacrificial polymer 201 in a cavity reserved for this purpose. This polymer may be a resin resistant to the subsequent deposition of nitride for example and is intended to be removed thereafter. A planarization (chemical-mechanical polishing) operation is then carried out on the sacrificial layer.

Figure 4B:
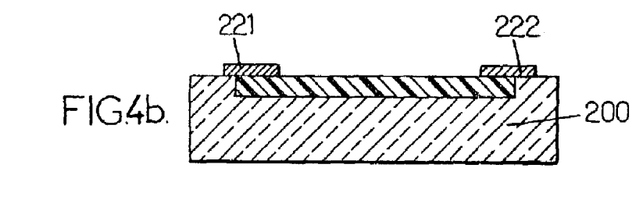
FIG. 4(b) is a schematic sectional view on A-A of a second step in the manufacturing of a microelectromechanical system according to the invention.

In the second step shown in FIG. 4(b), two resistive elements or pads, in this case 221 and 222, are deposited on top of the polished surface. They may in particular be made of aluminum so as to assist with the bimetallic effect. They correspond to the pads located beneath the first deformable element.

Figure 4C:
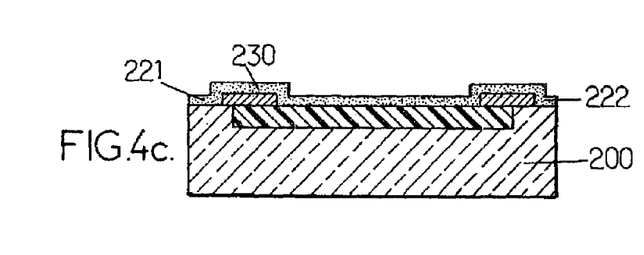
FIG. 4(c) is a schematic sectional view on A-A of a third step in the manufacturing of a microelectromechanical system according to the invention.

In a third step shown in FIG. 4(c), a highly compressive membrane 230, for example made of silicon nitride Si$_3$N$_4$, is deposited as two layers. Deposited between these two layers are resistive heating elements (not shown) made of titanium nitride TiN, each plumb with the pads corresponding to the resistive elements. The current leads for these heating electrodes are also produced in this step. Such an operation of depositing silicon nitride compressive membranes may be carried out according to the principles set out in the article by K. Osada, et al.: "Effect of stress in the deposited silicon nitride films on boron diffusion of silicon", published in J. Electrochem. Soc., Vol. 142, No. 1, January 1995, the disclosure of which is incorporated by reference.

Figure 4D:
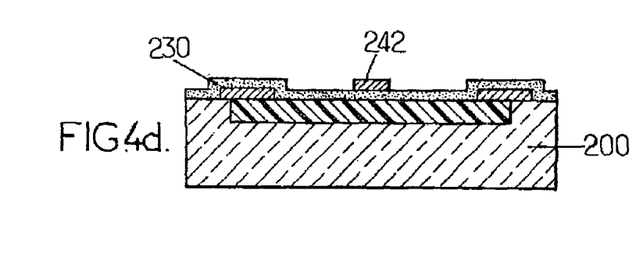
FIG. 4(d) is a schematic sectional view on A-A of a fourth step in the manufacturing of a microelectromechanical system according to the invention.

The latter two pads serving for the bimetallic effect are deposited in the fourth step shown in FIG. 4(d). Only the pad 242 is shown in this figure for the cross-section A-A.

Figure 4E:
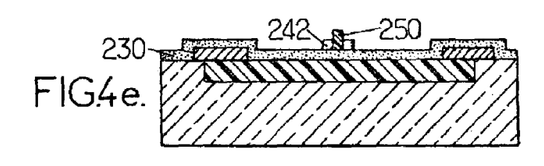
FIG. 4(e) is a schematic sectional view on A-A of a fifth step in the manufacturing of a microelectromechanical system according to the invention.

A second sacrificial layer 250 is deposited and then partly etched during the fifth step shown in FIG. 4(e), so as to prepare the deposition of the separate conducting elements.

Figure 4F:
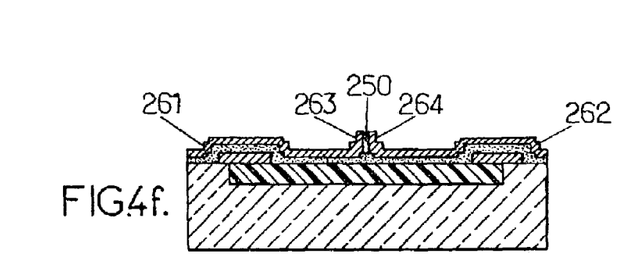
FIG. 4(f) is a schematic sectional view on A-A of a sixth step in the manufacturing of a microelectromechanical system according to the invention.
Figure 4G:
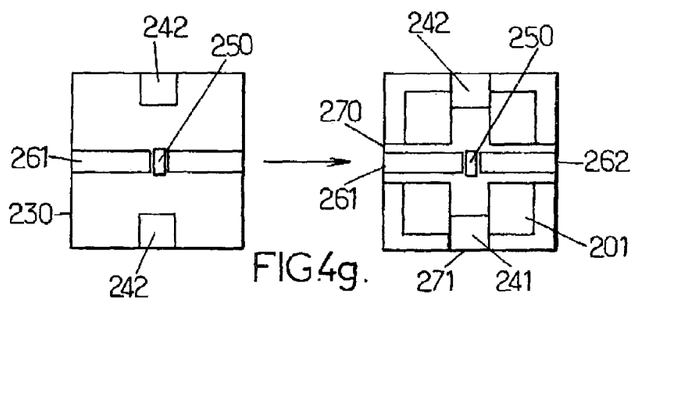
FIG. 4(g) is a schematic top view of a seventh step in the manufacturing of a microelectromechanical system according to the invention.

A full-wafer deformation of metal is carried out in the sixth step shown in FIG. 4(f), followed by selective etching of the metal so as to obtain the two separate conducting elements 261 and 262. The metal lying on the layer 250 between the ends 263 and 264 is removed so as to ensure electrical discontinuity.

A top view of the result of the sixth step is shown on the left side of FIG. 4(g), again indicating the pads 241 and 242 lying on the silicon nitride layer that covers the entire cavity. Further selective etching, this time of the nitride, allows the two integral deformable elements 270 and 271 to be exposed as shown in the right side of FIG. 4(g).

Removing the sacrificial layers then allows the deformable elements to be freed, which, because of the stored internal energy resulting from depositing the silicon nitride layer in compression, switch into one or other of the stable positions.

Depending on the buckling position, i.e. whether there is or is not electrical continuity, it may prove necessary to carry out a step of resetting the microelectromechanical system using the switch control elements.

Figure 5A:
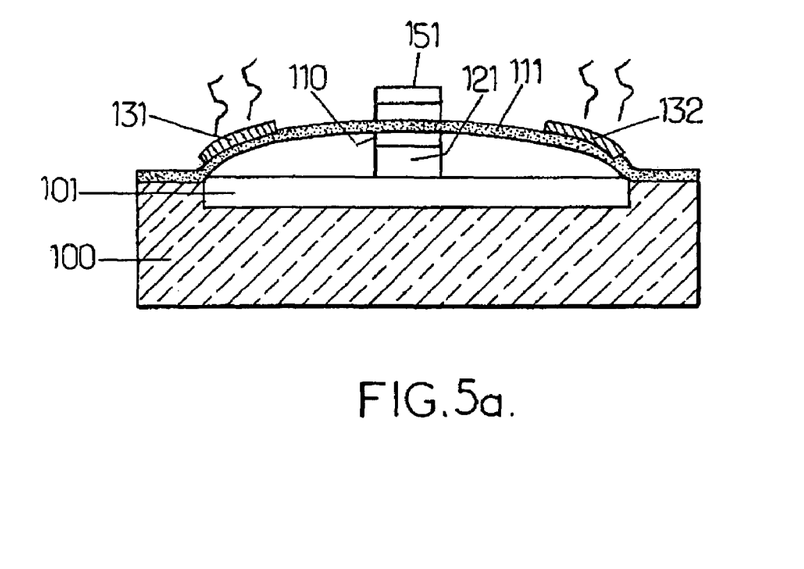
FIG. 5(a) is a schematic sectional view on A-A of one embodiment of a microelectromechanical system according to the invention, when the microelectromechanical system is deactuated.
Figure 5B:
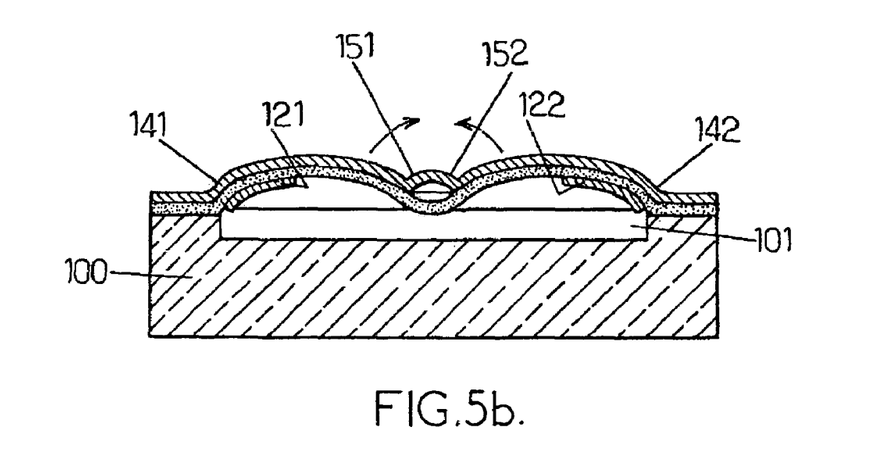
FIG. 5(b) is a schematic sectional view on B-B of one embodiment of a microelectromechanical system according to the invention, when the microelectromechanical system is actuated.

FIGS. 5(a) and 5(b) show cross-sectional views of FIG. 3. The same numerals correspond to the same elements as in FIG. 3.

FIG. 5(a) shows a cross-sectional view on plane A-A of FIG. 3. The microelectromechanical system is in the deactuated state since the deformable elements 110 and 111 are in the first stable position. The resistive elements 131 and 132 are located in the upper part of the deformable element 111. When an electrical control current flows in the resistive elements 131 and 132 or in the heating electrodes (not shown) plumb with the resistive elements 131 and 132, the bimetallic effect resulting from the differential expansion between the resistive elements and the deformable element 111 forces the latter and the integral deformable element 110 into the second stable position, shown in FIG. 5(b).

FIG. 5(b) shows a cross-sectional view on plane B-B of FIG. 3. The deformable elements 110 and 111 are in the second stable position. The arms 151 and 152 are then in contact, thanks solely to the internal energy of the deformable elements 110 and 111, due to the buckling. This ensures electrical continuity between the separate conducting elements 141 and 142. The microelectromechanical system is then in the actuated state.

It may be noted that, should the stresses and therefore the geometry of the beams change over time, the contacts facing each other undergo the same displacement and therefore the risk of misalignment is greatly reduced.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A microelectromechanical system, comprising:
   first and second separate conducting elements;
   a first electromechanically deformable element that can switch between a first stable position and a second stable position;
   contact elements allowing electrical continuity between the first and second separate conducting elements; and
   switch control elements ensuring that the first deformable element switches so as to establish the electrical continuity between the first and second separate conducting elements in the second stable position by contact between the contact elements and to break the electrical continuity by separating the contact elements in the first stable position,
   in which the first and second separate conducting elements and the contact elements are carried by the first deformable element.

2. The microelectromechanical system according to claim 1, in which the switch control elements furthermore comprise a second electromechanically deformable element separate from but joined to the first deformable element.

3. The microelectromechanical system according to claim 2, in which the first and second stable positions correspond to buckling positions of the first and/or second deformable element.

4. The microelectromechanical system according to claim 1, in which the first and second stable positions correspond to buckling positions of the first deformable element.

5. The microelectromechanical system according to claim 1, in which the switch control elements comprise first switch control elements for switching from the second stable position to the first stable position and second switch control elements for switching from the first stable position to the second stable position.

6. The microelectromechanical system according to claim 5, in which the first and/or second switch control elements comprise at least one resistive element in contact with one of the first and second deformable elements, the resistive element ensuring that switching takes place between the two stable positions by a bimetallic effect when an electrical control current flows through it or when it receives a supply of heat.

7. The microelectromechanical system according to claim 5, in which the second switch control elements comprise electrostatic deformation elements, including at least one pair of facing electrodes, one of which is joined to one of the first and second deformable elements and the other of which is located so that, when the first deformable element has switched into the second stable position, the gap between the facing electrodes is a minimum in one of the stable positions and a maximum in the other.

8. The microelectromechanical system according to claim 5, in which the first and/or second switch control elements comprise at learn one magnetically sensitive element joined to one of the lint and second deformable elements and elements generating a variable magnetic field which are suitable for causing switching into one of the stable positions.

9. The microelectromechanical system according to claim 5, in which the first and/or second switch control elements comprise piezoelectric deformation elements, comprising at least one piezoelectric element joined to one of the first and second deformable elements so that an electrical voltage applied to the piezoelectric element causes switching into one of the first and second stable positions.

10. The microelectromechanical system according to claim 5, in which the first and second switch control elements are identical.

11. The microelectromechanical system according to claim 5, in which the first and second switch control elements are different.

12. The microelectromechanical system according to claim 1, in which the contact elements comprise at least two separate and electrically conducting arms linked to the separate conducting elements respectively, and are placed on the first and second separate conducting elements ad as to make a non-zero angle With the first deformable element, and so as to be in contact with each other so as to establish electrical continuity between the separate conducting elements when the deformable elements are in the first stable position and to be separated from each other when the deformable elements are in the second stable position.

13. A semiconductor structure, comprising:
a substrate;
an electromechanically deformable element having a portion thereof suspended above the substrate;
a first conductor positioned on the electromechanically deformable element, the first conductor including a first contact element; and
a second conductor also positioned on the electrically deformable element, the second conductor including a second contact element separated from the first contact element;
wherein the first and second contact elements touch each other when the electromechanically deformable element is deformed.

14. The structure of claim 13 wherein the electromechanically deformable element is a beam.

15. The structure of claim 14 wherein the beam is supported by at least two ends thereof.

16. The structure of claim 13 wherein the electromechanically deformable element is deformable between a first stable position where the first and second contact elements do not touch and a second stable position where the first and second contact elements do touch.

17. The structure of claim 16 wherein at least one of the first and second stable positions is a buckle position with respect to the electromechanically deformable element.

18. The structure of claim 13 wherein the electromechanically deformable element includes a first portion and a second portion, the first portion including a first deformation structure used to deform the electromechanically deformable element from a first stable position where the first and second contact elements do not touch to a second stable position where the first and second contact elements do touch, and the second portion including a second deformation structure used to deform the electromechanically deformable element from the second stable position to the first stable position.

19. The structure of claim 18 wherein the first and second deformation structures comprise bimetallic actuators.

20. A semiconductor structure, comprising:
a substrate;
an electromechanically deformable element having a portion thereof suspended above the subtrate, the electromechanically deformable element being deformable between a first stable position and a second stable position;
a first conductor positioned on the electromechanically deformable element, the first conductor including a first contact element; and
a second conductor also positioned on the electrically deformable element, the second conductor including a second contact element separated from the first contact element when the electromechanically deformable element is in the first stable position, the second contact element touching the first contact element when the electromechanically deformable element is in the second stable position.

21. The structure of claim 20 further including means for deforming the electromechanically deformable element between the first and second stable positions.

22. The structure of claim 20 wherein the electromechanically deformable element has a beam shape.

23. The structure of claim 22 wherein the beam shape includes at least two legs.

24. The structure of claim 20 wherein the second stable position is a buckled position with respect to the electromechanically deformable element.

25. The structure of claim 20 wherein the electromechanically deformable clement includes a first portion and a second portion, to first portion including a first deformation structure used to deform the electromechanically deformable clement from the first stable position to the second stable position, and the second portion including a second deformation structure used to deform the elecromechanically deformable element from to second stable position to the first stable position.

26. The structure of claim 25 wherein to first and second deformation structures comprise bimetallic actuators.

* * * * *

UNITED STATES PATENT AND TRADEMARK OFFICE
CERTIFICATE OF CORRECTION

| | | |
|---|---|---|
| PATENT NO. | : 7,268,653 B2 | |
| APPLICATION NO. | : 11/050482 | |
| DATED | : September 11, 2007 | |
| INVENTOR(S) | : Guillaume Bouche | |

It is certified that error appears in the above-identified patent and that said Letters Patent is hereby corrected as shown below:

In the Claims:

At column 8, claim number 8, line number 60, please replace the word [learn] with the word -- least --.

At column 8, claim number 8, line number 61, please replace the word [lint] with the word -- first --.

At column 9, claim number 12, line number 15, please replace the word [ad] with the word -- so --.

At column 9, claim number 12, line number 16, please replace the word [With] with the word -- with --.

At column 9, claim number 17, line number 46, please replace the word [buckle] with the word -- buckled --.

At column 10, claim number 20, line number 13, please replace the word [subtrate] with the word -- substrate --.

At column 10, claim number 25, line number 39, please replace the word [clement] with the word -- element --.

At column 10, claim number 25, line number 40, please replace the word [to] with the word -- the --.

At column 10, claim number 25, line number 42, please replace the word [clement] with the word -- element --.

At column 10, claim number 25, line number 44-45, please replace the word [elecromechanically] with the word -- electromechanically --.

At column 10, claim number 25, line number 45, please replace the first instance of the word [to] with the word -- the --.

At column 10, claim number 26, line number 47, please replace the word [to] with the word -- the --.

Signed and Sealed this
Thirtieth Day of August, 2011

David J. Kappos
*Director of the United States Patent and Trademark Office*